(12) United States Patent
Yoon et al.

(10) Patent No.: US 8,558,295 B2
(45) Date of Patent: Oct. 15, 2013

(54) NONVOLATILE MEMORY CELL AND METHOD OF MANUFACTURING THE SAME

(75) Inventors: Sung Min Yoon, Daejeon (KR); Chun Won Byun, Daejeon (KR); Shin Hyuk Yang, Gyeonggi-do (KR); Sang Hee Park, Daejeon (KR); Soon Won Jung, Daejeon (KR); Seung Youl Kang, Daejeon (KR); Chi Sun Hwang, Daejeon (KR); Byoung Gon Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 460 days.

(21) Appl. No.: 12/838,878

(22) Filed: Jul. 19, 2010

(65) Prior Publication Data
US 2011/0049592 A1    Mar. 3, 2011

(30) Foreign Application Priority Data
Aug. 25, 2009 (KR) .................. 10-2009-0078459
Mar. 31, 2010 (KR) .................. 10-2010-0029135

(51) Int. Cl.
*H01G 7/06* (2006.01)
(52) U.S. Cl.
USPC .............................. 257/295; 438/3; 438/785
(58) Field of Classification Search
USPC ............................................... 257/295
See application file for complete search history.

(56) References Cited

U.S. PATENT DOCUMENTS

| | | | | |
|---|---|---|---|---|
| 5,592,013 A * | 1/1997 | Honda | ............................ | 257/392 |
| 5,621,683 A * | 4/1997 | Young | ...................... | 365/185.05 |
| 5,821,688 A * | 10/1998 | Shanks et al. | .................. | 313/498 |
| 6,017,794 A * | 1/2000 | Burns et al. | ..................... | 438/258 |
| 6,207,472 B1 | 3/2001 | Callegari et al. | | |
| 6,498,369 B1 | 12/2002 | Yamazaki et al. | | |
| 6,573,604 B1 | 6/2003 | Kajita | | |
| 6,812,509 B2 * | 11/2004 | Xu | ................ | 257/295 |
| 7,408,187 B2 * | 8/2008 | Kim et al. | ........................ | 257/40 |
| 7,851,787 B2 * | 12/2010 | Han | ................. | 257/40 |

(Continued)

FOREIGN PATENT DOCUMENTS

| | | |
|---|---|---|
| JP | 01-243572 A | 9/1989 |
| JP | 2002-319682 A | 10/2002 |

(Continued)

OTHER PUBLICATIONS

Arun Suresh et al., "Transparent indium gallium zinc oxide transistor based floating gate memory with platinum nanoparticles in the gate dielectric", Applied Physics Letters, vol. 94, Issue 12, 2009, pp. 123501-1-123501-3.

(Continued)

*Primary Examiner* — Chuong A. Luu
*Assistant Examiner* — Jaehwan Oh
(74) *Attorney, Agent, or Firm* — Rabin & Berdo, P.C.

(57) ABSTRACT

Provided are a nonvolatile memory cell and a method of manufacturing the same. The nonvolatile memory cell includes a memory transistor and a driver transistor. The memory transistor includes a semiconductor layer, a buffer layer, an organic ferroelectric layer, and a gate electrode, which are disposed on a substrate. The driver transistor includes the semiconductor layer, the buffer layer, a gate insulating layer, and the gate electrode, which are disposed on the substrate. The memory transistor and the driver transistor are disposed on the same substrate. The nonvolatile memory cell is transparent in a visible light region.

14 Claims, 11 Drawing Sheets

(56) References Cited

U.S. PATENT DOCUMENTS

| | | | |
|---|---|---|---|
| 8,198,625 B2* | 6/2012 | Yoon et al. | 257/40 |
| 2004/0002176 A1* | 1/2004 | Xu | 438/40 |
| 2004/0075783 A1 | 4/2004 | Lee | |
| 2005/0059172 A1 | 3/2005 | Kim | |
| 2005/0077606 A1* | 4/2005 | Schmid et al. | 257/679 |
| 2006/0108579 A1* | 5/2006 | Kim et al. | 257/40 |
| 2007/0054462 A1* | 3/2007 | Ozaki et al. | 438/396 |
| 2007/0152211 A1* | 7/2007 | Han | 257/40 |
| 2007/0252137 A1 | 11/2007 | Gelinck et al. | |
| 2007/0278603 A1* | 12/2007 | Ochiai et al. | 257/421 |
| 2009/0116276 A1 | 5/2009 | Haramoto et al. | |
| 2009/0149007 A1 | 6/2009 | Jung et al. | |
| 2009/0218605 A1* | 9/2009 | Jain | 257/288 |
| 2009/0302363 A1 | 12/2009 | Nagai | |
| 2011/0095272 A1* | 4/2011 | Ng et al. | 257/40 |
| 2012/0132882 A1* | 5/2012 | Seo et al. | 257/4 |

FOREIGN PATENT DOCUMENTS

| | | |
|---|---|---|
| JP | 2003-324185 A | 11/2003 |
| JP | 2005-175386 A | 6/2005 |
| JP | 2006-210525 A | 8/2006 |
| JP | 2006-245184 A | 9/2006 |
| JP | 2006-253474 A | 9/2006 |
| JP | 2007-299850 A | 11/2007 |
| JP | 2008-042114 A | 2/2008 |
| JP | 2008-135731 A | 6/2008 |
| JP | 2008-270313 A | 6/2008 |
| JP | 2008-270240 A | 11/2008 |
| JP | 2010-034090 A | 2/2010 |
| KR | 2001-0006985 | 1/2001 |
| KR | 10-0646737 | 11/2006 |
| KR | 2008-0097977 A | 11/2008 |
| WO | WO 2008/065927 A1 | 6/2008 |
| WO | WO 2008/102443 A1 | 8/2008 |
| WO | WO 2009/054707 A2 | 4/2009 |

OTHER PUBLICATIONS

Jung Won Seo et al., "Transparent resistive random access memory and its characteristics for nonvolatile resistive switching", Applied Physics Letters, vol. 93, Issue 22, 2008, pp. 223505-1~223505-3.

Seok Hwan Noh et al., "ZnO-based nonvolatile memory thin-film transistors with polymer dielectric/ferroelectric double gate insulators", Applied Physics Letters, vol. 90, Issue 25, 2007, pp. 253504-1~253504-3.

M. W. J. Prins et al., "A ferroelectric transparent thin-film transistor", Applied Physics Letters, vol. 68, Issue 25, 1996, pp. 3650-3652.

* cited by examiner

NONVOLATILE MEMORY CELL AND METHOD OF MANUFACTURING THE SAME

CROSS-REFERENCE TO RELATED APPLICATION

This application claims priority to and the benefit of Korean Patent Application Nos. 10-2009-0078459, filed Aug. 25, 2009, and 10-2010-0029135, filed Mar. 31, 2010, the disclosure of which is incorporated herein by reference in its entirety.

BACKGROUND

1. Field of the Invention

The present invention relates to a semiconductor device and a method of manufacturing the same and, more particularly, to a nonvolatile memory cell and a method of manufacturing the same.

2. Discussion of Related Art

The advancement of silicon-based material and device technology, i.e., silicon electronics, has led to the development of the electronic industry. However, the silicon electronics may include hard, breakable materials and be opaque in the visible light region. In recent years, in order to overcome the restrictions of the silicon electronics, flexible electronics in which electronic devices and systems are manufactured on a flexible substrate and transparent electronics in which transparent electronic devices and systems are manufactured have been proposed. In addition, research and development are being conducted on various applications, such as sensors, displays, electronic circuits, and batteries.

In the field of transparent electronics, a transparent thin-film transistor (TFT) technique and a transparent display technique using a transparent TFT as a driver circuit are rapidly being developed. Currently, technical development enters into a step of raising technology maturity for putting the transparent TFTs and displays to practical use and a step of designing target applications in order to realize transparent electronic circuits on a substrate using a driver transistor.

However, technical development of transparent devices (i.e., driver transistors) for displaying and processing data is briskly progressing, while technical development of memory transistors for storing data is falling behind. Since a memory device may be mounted outside a system, it may be less necessary to make the memory device transparent. However, by mounting the memory device inside the system, it may be more effective to control the functions of the memory device and reduce not only power consumption but also the cost of the mounting of the memory device.

Thus, the following points may be required to mount the memory device inside the system.

First, the memory device may be a nonvolatile memory device.

Memory devices may be classified into volatile memories and nonvolatile memories depending on how to store data. The volatile memories may store data only during the supply of power, while the nonvolatile memories may store data even if power is interrupted. Since transparent electronics are highly likely to embody a stand-alone electronic device to which power is always supplied or a design-oriented application with a mobile function, the functions of the nonvolatile memory device may be required to increase the lifespan of batteries and retain capability to store a large amount of data.

Second, an operating voltage of the memory device may be within a predetermined range. When an excessively high operating voltage is required for a memory operation in consideration of only transparency, the entire system cannot resist to the high voltage and it may become unnecessary to mount the memory device within the system or an integrated circuit (IC). Furthermore, the memory device should be capable of stable operations within the range of an operating voltage of a module used together with the memory device.

Third, the size of the memory device should not be excessively large. A memory transistor for a transparent electronics system may be not only a data storage device but also an embedded memory of the system. Thus, the size of the memory transistor may be minimized to downscale the entire system.

Fourth, high device stability appropriate for the required operation of a system should be ensured. A nonvolatile memory device should have tolerance to repeated write operations, that is, a good cycling characteristic. Also, the nonvolatile memory device should have a good data retention characteristic. Furthermore, the nonvolatile memory device should be highly capable of retaining stored data under high-temperature or humid conditions. Although a memory device used for transparent electronics may not satisfy high reliability required for typical silicon electronics, the memory device used for the transparent electronics needs to satisfy reliability specification required by the corresponding application.

Conventionally, in order to provide a nonvolatile memory that meets the foregoing requirements and exhibits transparency and flexibility, the following operating principles of the memory transistor may be provided.

First, a transparent oxide layer having a large energy bandgap may be used, and the resistance of the oxide layer may be varied with the application of a voltage. That is, the resistance of the oxide layer may be varied according to the magnitude or direction of a voltage applied to the oxide layer so as to store data. A device using the above-described method may be typically referred to as an oxide resistive memory device, which has been highlighted as an advanced nonvolatile memory device that will replace a flash memory device.

In order to apply the above-described operating principles to transparent electronics, components of the entire device need to be formed of transparent materials. Thus, an oxide layer, which is an essential component of a resistive memory device, should be formed of a material that has a large bandgap and experiences a wide range of resistance variation according to the magnitude or direction of an applied voltage.

Since an oxide resistive memory device has a relatively simple structure, an area occupied by the entire memory may be greatly reduced. However, it is known that the principle on which the resistance of the oxide resistive memory varies with the magnitude or direction of the applied voltage was not completely revealed, and the characteristics of the oxide resistive memory are greatly varied according to materials of upper and lower electrodes. That is, it may be difficult to uniformize the characteristics of devices and predict a variation of device characteristics relative to process variations. Also, since the operating principles of the oxide resistive memory are not clearly disclosed, adopting the oxide resistive memory as an embedded memory transistor of the system may be difficult.

Second, a charge storage region may be prepared in a predetermined portion of a memory device so that a threshold voltage of a transistor may be varied according to the magnitude and direction of an applied voltage to embody a memory operation. The charge storage region may be a thin layer constituting a portion of a gate of the transistor or nanodots. In general, this technique may be referred to as a nano-floating-gate memory that is developed as a portion of advanced flash memory technology in conventional silicon electronics. By adding a process of preparing the charge storage region in a partial region of a gate sack while using the structure of a transparent or flexible TFT as it is, a memory device may be manufactured using a relatively simple process.

However, since an oxide or organic material is used as a semiconductor material, it may be more difficult to quantitatively control the storage of charges than when silicon semiconductor is used. Also, an oxide or organic semiconductor TFT using an accumulation layer and a depletion layer cannot reduce a required voltage due to its driving characteristics.

Third, a memory device may adopt an organic thin layer with predetermined characteristics, and the resistance of the organic thin layer may be changed with the application of a voltage. In general, the memory device may be referred to as an organic or polymer memory, which enables the formation of a flexible memory device on a flexible substrate at low cost.

However, a change in the resistance of an organic thin layer may not be fully comprehended. Also, current research results propose a different opinion that the change in the resistance of the organic thin layer results from the storage of charges mentioned above as the second technique rather than the characteristics of an organic material. Thus, a doubt is being thrown on the feasibility of an organic or polymer memory device. Furthermore, according to conventional research results, although continuous attempts are being made at embodying a memory operation using various materials, it has been reported that the memory operation using the various materials are seriously problematic in terms of operation reproducibility, reliability, and environmental tolerance. Therefore, much more research on embodying flexible memory devices using the above-described method is required from now on.

Fourth, a ferroelectric thin layer may be used as a gate insulating layer of a TFT. Thus, a threshold voltage of the TFT may be changed according to a voltage application direction using the remnant polarization of the ferroelectric thin layer to embody a memory operation. Alternatively, a ferroelectric thin layer may be inserted between upper and lower conductive electrode layers to constitute a ferroelectric capacitor. Thus, a memory operation may be embodied using a difference in current of reversal of polarization caused by a variation in the remnant polarization of the ferroelectric thin layer with the voltage application direction.

The above-described technique may be typically referred to as a ferroelectric memory developed as a part of advanced nonvolatile memory technology in conventional silicon electronics. The ferroelectric memory device may be manufactured using a very simple process by adopting a transparent or flexible TFT as it is and replacing a process of forming a gate insulating layer by a process of forming a ferroelectric thin layer or forming a ferroelectric thin layer between conductive electrode layers. Furthermore, a memory device may be easily designed on relatively physically predictable operating principles based on the remnant polarization of a ferroelectric material.

However, an oxide-based ferroelectric thin layer should undergo a crystallization process so that a memory device can operate using predetermined ferroelectric characteristics. Since the oxide-based ferroelectric thin layer may be crystallized at a temperature of about 500° C. or higher, the oxide-based ferroelectric layer may be incompatible in terms of processes with transparent and flexible TFTs manufactured at temperatures of about 300° C. or lower.

Moreover, although an organic ferroelectric thin layer may be employed, the organic ferroelectric thin layer may generally cause a large leakage current to preclude formation of a thin layer. In addition, the organic ferroelectric thin layer may have little tolerance to chemicals or device fabrication processes and cannot be easily put to practical use.

SUMMARY OF THE INVENTION

The present invention is directed to a transparent nonvolatile memory cell including a memory transistor and a driver transistor, which are disposed on the same substrate, and a method of manufacturing the same.

One aspect of the present invention provides a nonvolatile memory cell including: a memory transistor including a semiconductor layer, a buffer layer, an organic ferroelectric layer, and a gate electrode disposed on a substrate; and a driver transistor including the semiconductor layer, the buffer layer, a gate insulating layer, and the gate electrode disposed on the substrate.

Another aspect of the present invention provides a method of manufacturing a nonvolatile memory cell. The method includes: forming a plurality of source and drain electrodes at predetermined intervals on a substrate including a memory transistor region and a driver transistor region; forming a semiconductor layer and a buffer layer on an exposed portion of the substrate between the source and drain electrodes; forming an organic ferroelectric layer on the resultant structure having the buffer layer; selectively removing the organic ferroelectric layer formed on the driver transistor region; forming a gate insulating layer on the resultant structure from which the organic ferroelectric layer is selectively removed; forming a plurality of source and drain electrode pads to be connected to the plurality of source and drain electrodes, respectively; and forming a gate electrode over the organic ferroelectric layer of a memory transistor and the gate insulating layer of a driver transistor.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

Figure 1A:
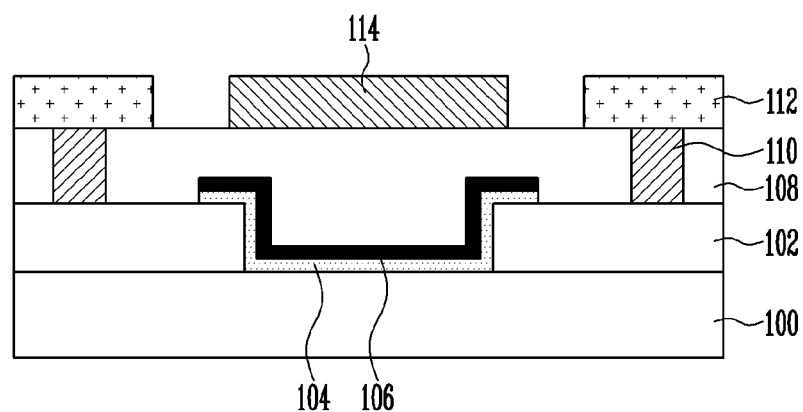
FIGS. 1A and 1B are cross-sectional views of a nonvolatile memory cell according to a first exemplary embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

Figure 1B:
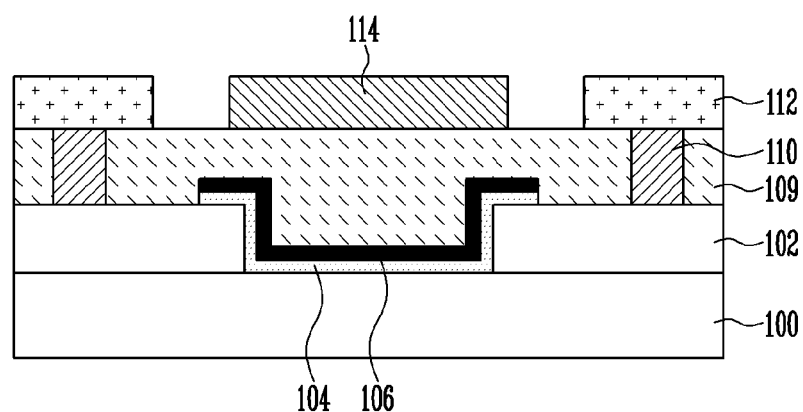

FIGS. 1A and 1B are cross-sectional views of a nonvolatile memory cell according to a first exemplary embodiment of the present invention. FIG. 1A is a cross-sectional view of a memory transistor, and FIG. 1B is a cross-sectional view of a driver transistor.

Referring to FIG. 1A, a memory transistor may include a semiconductor layer 104, a buffer layer 106, an organic ferroelectric layer 108, and a gate electrode 114, which are disposed on a substrate 100. Also, the memory transistor may further include a plurality of source and drain electrodes 102, a plurality of contact plugs 110, and a plurality of source and drain electrode pads 112. The plurality of source and drain electrodes 102 may be disposed on the substrate 100 at predetermined intervals. The plurality of contact plugs 110 may be connected to the plurality of source and drain electrodes 102, respectively. The plurality of source and drain electrode pads 112 may be connected to the plurality of source and drain electrodes 102 through the plurality of contact plugs 110, respectively.

Referring to FIG. 1B, a driver transistor may include a semiconductor layer 104, a buffer layer 106, a gate insulating layer 109, and a gate electrode 114, which are disposed on a substrate 100. Also, the driver transistor may further include a plurality of source and drain electrodes 102, a plurality of contact plugs 110, and a plurality of source and drain electrode pads 112. The plurality of source and drain electrodes 102 may be formed at predetermined intervals on the substrate 100. The plurality of contact plugs 110 may be connected to the plurality of source and drain electrodes 102, respectively. The plurality of source and drain electrode pads 112 may be connected to the plurality of source and drain electrodes 102 by the plurality of contact plugs 110, respectively. The driver transistor having the above-described structure may function as a driving device configured to drive the memory transistor.

That is, the memory transistor and the driver transistor may have the same structure and include some layers formed of different materials. In particular, the memory transistor may include the organic ferroelectric layer 108, while the driver transistor may include the gate insulating layer 109. The memory transistor and the driver transistor may have the same structure formed of the same materials except for the organic ferroelectric layer 108 and the gate insulating layer 109. Thus, the memory transistor and the driver transistor may be integrated on the same substrate 100.

Hereinafter, the respective components will be described in more detail.

The substrate 100 may be formed of a transparent material. For example, the substrate 100 may be a glass substrate or a plastic substrate.

The source and drain electrodes 102 may be formed of a transparent conductive oxide (TCO) thin layer, for example, an indium thin oxide (ITO) layer. Alternatively, the source and drain electrodes 102 may be formed of a conductive oxide thin layer having sufficiently low resistance and sufficient transparency.

The source and drain electrodes 102 may include a source electrode and a drain electrode disposed respectively on two regions of the substrate 100, which are electrically isolated from each other at predetermined intervals. Here, a region of the substrate 100 interposed between the source and drain electrodes may correspond to channel regions of the memory and driver transistors. Thus, the channel width and channel length of the memory and driver transistors may be determined by a pattern width and inter-pattern distance of the source and drain electrodes 102. In this case, the channel width and distance of the memory and driver transistors may be designed to different values in consideration of operating characteristics of the memory and driver transistors.

The semiconductor layer 104 may be formed on the substrate 100 between the source and drain electrodes 102. That is, the semiconductor layer 104 may be formed on the channel region of the memory transistor or the driver transistor to partially cover sidewalls and top surfaces of the source and drain electrodes 102.

In this case, the semiconductor layer 104 may function as semiconductors of the memory and driver transistors. That is, each of the memory transistor and the driver transistor according to an exemplary embodiment of the present invention may have a thin-film transistor (TFT) structure.

The semiconductor layer 104 may include a transparent semiconducting oxide layer, which is formed of an oxide having a wide energy bandgap and transparency in a visible light region and has an electrical semiconductor property. For example, the semiconductor layer 104 may be formed of zinc oxide (ZnO), indium-gallium-zinc oxide (In—Ga—Zn—O), zinc-tin oxide (Zn—Sn—O), or an oxide containing at least two elements selected from the group consisting of Zn, In, Ga, tin (Sn), and aluminum (Al). Alternatively, the formation of the semiconductor layer 104 may include doping various elements to one of the above-described oxides.

The buffer layer 106 may prevent further damage to the semiconductor layer 104 during a subsequent process and improve the characteristics of the memory and driver transistors. The buffer layer 106 may be disposed on the semiconductor layer 104 and formed on the channel region between the source and drain electrodes 102 along with the semiconductor layer 104 to partially cover the sidewalls and the top surfaces of the source and drain electrodes 102.

The function of the buffer layer 106 of the memory transistor will now be described.

First, damage to and degradation of the semiconductor layer 104 may be prevented during a subsequent process so that the semiconductor layer 104 can substantially perform its functions to allow the memory transistor to have good operating characteristics. Specifically, the buffer layer 104 may inhibit chemical degradation of the semiconductor layer 104 during the formation of the organic ferroelectric layer 108. The organic ferroelectric layer 108 may be formed by a coating process using an organic solution. In this case, the material characteristics of the semiconductor layer 104 may be degraded according to the kind of the organic solution. Thus, the buffer layer 106 formed on the semiconductor layer 104 may prevent chemical degradation of the semiconductor layer 104. Also, the buffer layer 106 may inhibit process degradation of the semiconductor layer 104 during subsequent processes of etching the semiconductor layer 104 and removing an etch mask.

Second, material and process conditions of the buffer layer 106 may be changed to improve the properties of the semiconductor layer 104. In particular, the process conditions may be varied during the formation of the buffer layer 106 to change the carrier concentration and surface state of the semiconductor layer 104, thereby enhancing the operating characteristics of the memory transistor.

Third, the buffer layer 106 may serve as an electrical buffer configured to inhibit generation of a leakage current of the organic ferroelectric layer 108. As the thickness of the organic ferroelectric layer 108 of the memory transistor decreases, the leakage current may increase due to the material characteristics of the organic ferroelectric layer 108. This may result in the deterioration of the operating characteristics of the memory transistor. Thus, when the buffer layer 106 may be interposed between the organic ferroelectric layer 108 and the semiconductor layer 104, the degradation of the semiconductor layer 104 due to the leakage current may be prevented.

The functions of the buffer layer 106 of the driver transistor will now be described.

First, degradation of the semiconductor layer 104 may be prevented during the etching of the semiconductor layer 104 and the removal of the etch mask.

Second, material and process conditions of the buffer layer 106 may be changed to improve the properties of the semiconductor layer 104. In particular, the process conditions may be varied during the formation of the buffer layer 106 to change the carrier concentration and surface state of the semiconductor layer 104, thereby enhancing the operating characteristics of the memory transistor.

Third, damage to the semiconductor layer 104 may be prevented during a subsequent process of etching the organic ferroelectric layer 108. In general, the etching of the organic ferroelectric layer 108 may be performed using oxygen plasma. In this case, the characteristics of the semiconductor layer 104 may be degraded due to the oxygen plasma. Thus, by forming the buffer layer 104 on the semiconductor layer 104, the degradation of the semiconductor layer 104 due to the oxygen plasma may be prevented. As a result, the degradation of the operating characteristics of the driver transistor may be prevented.

In consideration of the above description, the buffer layer 106 may sufficiently inhibit process degradation during the etching of the semiconductor layer 104 and retain a good electrical insulating characteristic capable of inhibiting occurrence of a leakage current of the organic ferroelectric layer 108. Furthermore, the buffer layer 106 may be formed of a material that can minimize increases in the operating voltages of the memory and driver transistors.

For example, the buffer layer 106 may be formed of a silicon-based insulating layer, such as a silicon oxide ($SiO_2$) layer, a silicon nitride (SiN) layer, or a silicon oxynitride (SiON) layer. Alternatively, the buffer layer 106 may be an aluminum oxide ($Al_2O_3$) layer, a hafnium oxide ($HfO_2$) layer, a zirconium oxide ($ZrO_2$) layer, a magnesium oxide (MgO) layer, a titanium oxide ($TiO_2$) layer, a tantalum oxide ($Ta_2O_5$) layer, a lanthanum oxide ($La_2O_3$) layer, or a strontium-titanium oxide ($SrTiO_3$) layer. Alternatively, the buffer layer 106 may be a silicate insulating layer formed of a mixture of silicon and a metal element constituting the above-described oxides.

The organic ferroelectric layer 108 of the memory transistor may be used as a main gate insulating layer of the memory TFT. In this case, the organic ferroelectric layer 108 may be formed of a ferroelectric material, such as a monomer or polymer organic material, which exhibits remnant polarization with application of a voltage.

For example, the organic ferroelectric layer 108 may be formed of poly(vinylidene fluoride (P(VDF)) and P(VDF-TrFE), which is a copolymer obtained by mixing P(VDF) with trifluorotethylene (TrFE) in an appropriate ratio. The mixture ratio of P(VDF) with TrFE may be controlled such that P(VDF-TrFE) exhibits a ferroelectric characteristic. For example, P(VDF) may be 55% or more. Of course, the mixture ratio may be controlled to optimize the leakage current and ferroelectric characteristics of the organic ferroelectric layer 108.

The driver transistor may include a gate insulating layer 109 instead of the organic ferroelectric layer 108. In this case, the gate insulating layer 109 may serve as a main gate insulating layer of the driver TFT. For example, the gate insulating layer 109 may be a silicon-based insulating layer, an aluminum oxide ($Al_2O_3$) layer, a hafnium oxide ($HfO_2$) layer, a zirconium oxide ($ZrO_2$) layer, a magnesium oxide (MgO) layer, a titanium oxide ($TiO_2$) layer, a tantalum oxide ($Ta_2O_5$) layer, a lanthanum oxide ($La_2O_3$) layer, or a strontium-titanium oxide ($SrTiO_3$) layer. The silicon-based insulating layer may be a silicon oxide ($SiO_2$) layer, a silicon nitride (SiN) layer, or a silicon oxynitride (SiON) layer. Alternatively, the gate insulating layer 109 may be a silicate insulating layer formed of a mixture of a mixture of silicon and a metal element constituting the above-described oxides. Of course, the gate insulating layer 109 may be formed of any material for a gate insulating layer of a typical TFT.

The source and drain electrode pads 112 may be electrically connected to the source and drain electrodes 102 through a contact plug 110 formed to partially penetrate the organic ferroelectric layer 108 or the gate insulating layer 109. For example, as shown in FIGS. 1A and 1B, the contact plug 110 of the memory transistor may be formed through the organic ferroelectric layer 108 and the gate insulating layer 109 of the driver transistor.

In this case, the source and drain electrode pads 112 may be formed of a TCO thin layer, for example, an ITO thin layer, or a conductive oxide thin layer having sufficiently low resistance and sufficient transparency.

The gate electrode 114 may be disposed over a portion of the organic ferroelectric layer 108 or the gate insulating layer 109, particularly, over channel regions of the memory and driver transistors. In this case, the gate electrode 114 may be formed of a TCO thin layer, for example, an ITO thin layer, or a conductive oxide thin layer having sufficiently low resistance and sufficient transparency. Furthermore, the gate electrode 114 may be disposed at the same level as the source and drain electrode pads 112 over the organic ferroelectric layer 108 or the gate insulating layer 109.

According to the above-described structure, the transparent nonvolatile memory cell may include a transparent memory TFT and a transparent driver TFT, which are formed on the same substrate 100.

Figure 2:
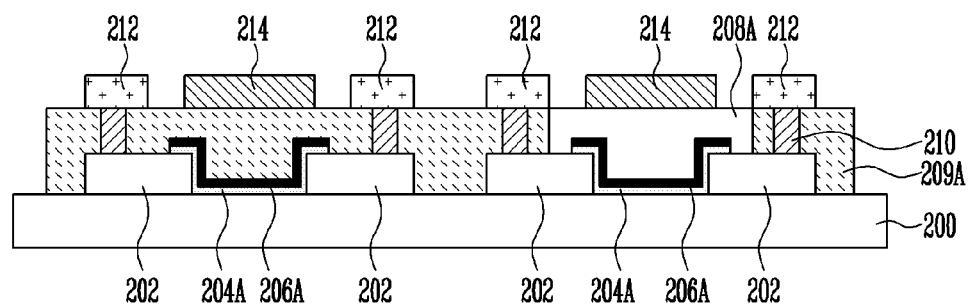
FIG. 2 is a cross-sectional view of a nonvolatile memory cell according to a second exemplary embodiment of the present invention.

FIG. 2 is a cross-sectional view of a nonvolatile memory cell according to a second exemplary embodiment of the present invention.

Referring to FIG. 2, according to the present embodiment, a memory transistor and a driver transistor may be disposed on the same substrate 200.

The memory transistor may include source and drain gate electrodes 202, a semiconductor layer 204A, a buffer layer 206A, an organic ferroelectric layer 208A, a contact plug 210, source and drain gate electrode pads 212, and a gate electrode 214, which are formed on the substrate 200. Also, the driver transistor may have the same structure as the memory transistor except that the driver transistor may include a gate insulating layer 209A instead of the organic ferroelectric layer 208A.

In particular, according to the present embodiment, the organic ferroelectric layer 208A may be formed only in a gate electrode region of the memory transistor, and the gate insulating layer 209A may be formed instead of the organic ferroelectric layer 208A in the remaining region other than the gate electrode region. In this case, contact plugs 210 of the memory and driver transistors may be formed through the gate insulating layer 209A. Also, the source and drain electrode pads 212 may be formed over the gate insulating layer 209A.

Figure 3:
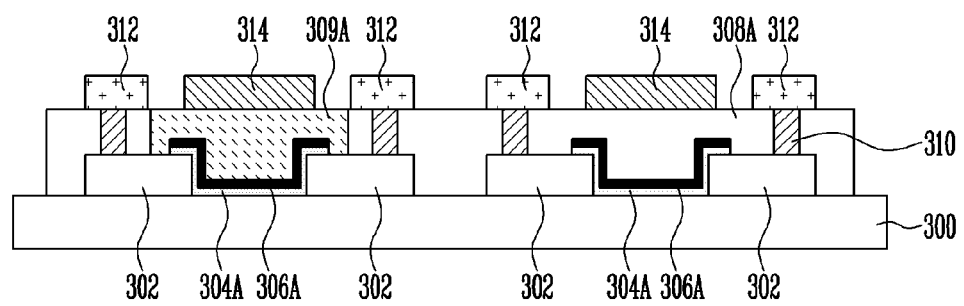
FIG. 3 is a cross-sectional view of a nonvolatile memory cell according to a third exemplary embodiment of the present invention.

FIG. 3 is a cross-sectional view of a nonvolatile memory cell according to a third exemplary embodiment of the present invention.

Referring to FIG. 3, a memory transistor and a driver transistor may be disposed on the same substrate 200.

The memory transistor may include source and drain gate electrodes 302, a semiconductor layer 304A, a buffer layer 306A, an organic ferroelectric layer 308A, a contact plug 310, source and drain gate electrode pads 312, and a gate electrode 314, which are formed on the substrate 300. Also, the driver transistor may have the same structure as the memory transistor except that the driver transistor includes a gate insulating layer 309A instead of the organic ferroelectric layer 308A.

In particular, according to the present embodiment, the gate insulating layer 309A may be formed only in a gate electrode region of the driver transistor, and the organic ferroelectric layer 308A may be formed instead of the gate insulating layer 309A in the remaining region other than the gate electrode region. In this case, contact plugs 310 of the memory and driver transistors may be formed through the organic ferroelectric layer 308A. Also, the source and drain electrode pads 312 may be formed over the organic ferroelectric layer 308A.

According to the above-described embodiment, a nonvolatile ferroelectric memory device having transparency and a memory function and a transparent driver device configured to drive the nonvolatile ferroelectric memory device may be integrated on the same substrate.

Hereinafter, methods of manufacturing nonvolatile memory cells according to exemplary embodiments of the present inventions will be described with reference to the drawings.

FIGS. 4A through 4I are cross-sectional views illustrating a method of manufacturing the nonvolatile memory cell of FIG. 2.

Figure 4A:
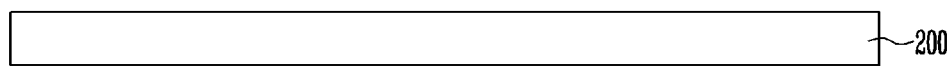
FIGS. 4A through 4I are cross-sectional views illustrating a method of manufacturing the nonvolatile memory cell of FIG. 2.

Referring to FIG. 4A, a substrate 200 on which a memory transistor and a driver transistor are integrated may be provided. As described above, the substrate 200 may be a glass or plastic substrate. When the substrate 200 is a plastic substrate, an appropriate preprocessing process may be performed to improve the flatness of the substrate 200.

Figure 4B:
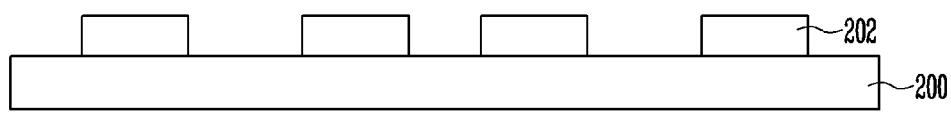

Referring to FIG. 4B, a conductive layer for source and drain electrodes may be formed on the substrate 200 and patterned, thereby forming a plurality of source and drain electrodes 202.

The conductive layer for the source and drain electrodes may be formed using a sputtering process and patterned using a wet or dry etching process. Also, the source and drain electrodes 202 may be formed to a thickness of about 50 to 150 nm.

Figure 4C:
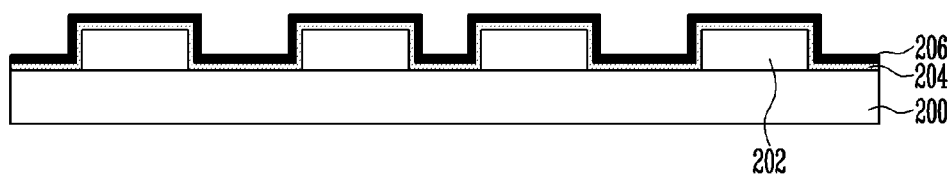

Referring to FIG. 4C, a semiconductor material layer 204 may be formed on the entire surface of the resultant structure having the source and drain electrodes 202, and a buffer material layer 206 may be formed on the semiconductor material layer 204.

In this case, since the thickness of the semiconductor material layer 204 significantly affects the operating conditions of the memory and driver transistors, the deposited thickness of the semiconductor material layer 204 may be determined in consideration of the following points.

First, the thickness of the semiconductor material layer 204 may be determined within such a range as to ensure the operating characteristics of the memory and driver transistors.

In general, the carrier concentration of a semiconductor material of a semiconductor layer may be directly associated with the thickness thereof. Thus, the semiconductor material layer 104 may be formed to a thickness of about 5 to 50 nm so that the semiconductor material layer 104 can function as a semiconductor layer of a driver transistor.

When a semiconductor layer has a thickness of less than about 5 nm, the thickness of the semiconductor layer may be smaller than the average distance by which carriers move in the surface of the semiconductor layer, thereby greatly dropping the mobility of the carriers. Meanwhile, when the semiconductor layer has a thickness of more than about 50 nm, the semiconductor layer may have an excessively high carrier concentration, thereby causing an increase in off-current and a reduction in an on/off operation margin. In this case, when the semiconductor layer has an extremely high carrier concentration, the operations of the driver transistor may be substantially disabled. Accordingly, in consideration of the first point, the semiconductor material layer 204 may have a thickness of about 5 to 50 nm.

Second, the thickness of the semiconductor material layer 204 may be determined such that the memory transistor may perform a memory operation at a lower voltage. In the present specification, although quantitative calculation required for determining the operating voltage of the memory transistor is omitted, the memory transistor may require a higher operating voltage in the case of off-operation programming than in on-operation programming. This is because an oxide semiconductor thin layer may operate in a depletion layer and an accumulation layer with a variation in applied voltage to be completely depleted and behave as an insulator under a specific voltage condition, unlike a typical silicon semiconductor layer operating in an inversion layer and an accumulation layer with a variation in applied voltage. Under the above-described conditions, loss of a programming voltage may occur due to a series capacitor formed by a complete depletion layer of the oxide semiconductor thin layer in a gate stack structure of the memory transistor, thus resulting in a rise in off-operation programming voltage. Accordingly, to suppress the above-described effects as much as possible and reduce an off-operation programming voltage, the thickness of the complete depletion layer of the oxide semiconductor thin layer should be minimized. In other words, the thickness of the oxide semiconductor thin layer should be minimized as much as possible. Therefore, in consideration of the second point, the semiconductor material layer 204 may be deposited to a thickness of about 20 nm or less.

As a result, in consideration of both the first and second points, the semiconductor material layer 204 may be formed to a thickness of about 5 to 20 nm.

Also, since the thickness of the buffer material layer 206 significantly affects the operating characteristics of the memory transistor, the deposited thickness of the buffer material layer 206 may be determined in consideration of the following points.

First, the thickness of the buffer material layer 206 may be determined within such a range as not to excessively increase the operating voltage of the memory transistor. That is, when the buffer material layer 206 has an excessively large thickness, a portion of a driving voltage of the memory transistor may be consumed by a series capacitor formed by a buffer layer constituting a portion of a gate stack of the memory transistor, thus resulting in a rise in the entire operating voltage. Thus, in consideration of the first point, the buffer material layer 206 may be formed to a thickness of about 10 nm or less.

Second, the thickness of the semiconductor material layer 204 may be determined within such a range as to sufficiently suppress process degradation of an etching process of the semiconductor material layer 204.

Third, the thickness may be determined within such a range as to sufficiently suppress a leakage current of an organic ferroelectric layer to be subsequently formed.

Therefore, in consideration of the second and third points, the buffer material layer 206 may be formed to a thickness of about 4 nm or more. As a consequence, in consideration of the first through third points, the buffer material layer 206 may be formed to a thickness of about 4 to 10 nm.

Meanwhile, the semiconductor material layer 204 and the buffer material layer 206 may be formed using a typical thin-film forming technique used for a semiconductor manufacturing process. For example, the semiconductor material layer 204 may be formed using at least one of an atomic layer deposition (ALD) technique, a chemical vapor deposition (CVD) technique, and a reactive sputtering technique or modifications thereof.

In this case, a process temperature, use or disuse of plasma, and a material of a thin layer may be determined not to degrade the characteristics of the semiconductor material layer 204 formed thereunder. In particular, the semiconductor material layer 204 and the buffer material layer 206 may be sequentially formed using the same apparatus.

Figure 4D:
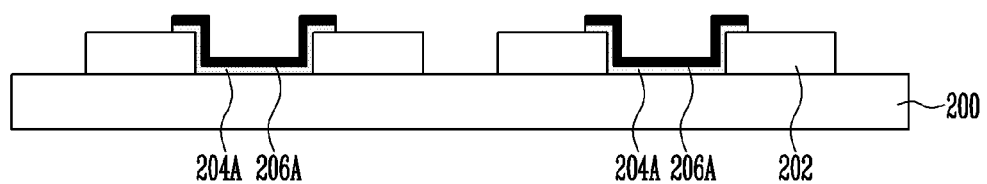

Referring to FIG. 4D, the buffer material layer 206 and the semiconductor material layer 204 may be etched, thereby forming a buffer layer 206A and a semiconductor layer 204A on channel regions of the memory and driver transistors.

In this case, the etching process may be performed using a photolithography process. For example, a wet etching process may be performed using a predetermined etchant, or a dry etching process may be performed using plasma. During the etching process, the buffer layer 206A may effectively inhibit degradation of the semiconductor layer 204A.

Figure 4E:
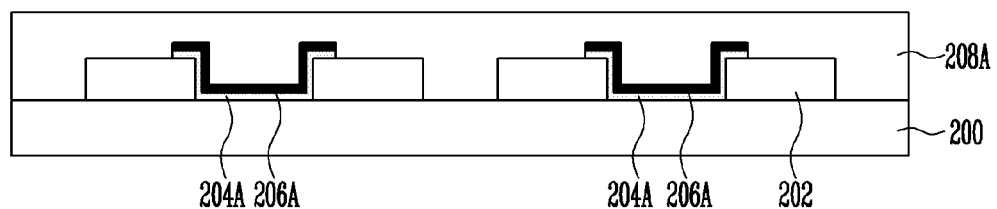

Referring to FIG. 4E, an organic ferroelectric material layer 208 may be formed on the entire surface of the resultant structure having the semiconductor layer 204A and the buffer layer 206A.

The organic ferroelectric material layer 208 may be formed using a spin coating technique. For example, when the organic ferroelectric material layer 208 is formed of P(VDF-TrFE), a material solution may be normally prepared by dissolving solid grains of P(VDF-TrFE) in an organic solvent. A typical process of forming the organic ferroelectric material layer 208 using a spin coating technique will now be described. To begin with, the material solution may be coated under a proper coating condition by dripping on a predetermined substrate and annealed at a predetermined temperature to volatilize the organic solvent from the material solution. Thereafter, an annealing process may be performed at a predetermined temperature to crystallize an organic ferroelectric layer. Typically, although a temperature at which the annealing process for volatilizing the organic solvent is performed may vary with the kind of the organic solvent, the temperature may range from about 50 to 120° C. Also, although the temperature at which the annealing process for the crystallization process is performed may vary with the kind of an organic ferroelectric material, when P(VDF-TrFE) is used as the organic ferroelectric material, the temperature may range from about 120 to 200° C. In this case, since the crystallization of the organic ferroelectric material layer 208 is necessarily required to allow the organic ferroelectric material layer 208 to have a good ferroelectric characteristic, selecting the crystallization temperature may be very important. When the crystallization temperature is excessively low, the organic ferroelectric material layer 208 may have a deficient crystallinity so that the organic ferroelectric material layer 208 cannot obtain desired electrical properties. Conversely, when the crystallization temperature is excessively high, the organic ferroelectric material layer 208 may completely melt and lose its ferroelectric characteristic.

Meanwhile, when the organic ferroelectric material layer 208 is formed by a spin coating process, the thickness of the organic ferroelectric material layer 208 may be controlled by adjusting the revolutions per minute (RPM) of the spin coating process and the concentration of the material solution.

In this case, the following two points may be considered to select an appropriate thickness of the organic ferroelectric material layer 208. First, the thickness of the organic ferroelectric material layer 208 may be selected to minimize an operating voltage of the memory transistor. To do this, the thickness of the organic ferroelectric material layer 208 may be minimized to facilitate reversal of polarization even at a low application voltage. However, according to conventional research results, when the thickness of the organic ferroelectric material layer 208 is reduced to a predetermined thickness or less, the ferroelectric characteristic of the organic ferroelectric material layer 208 may be greatly degraded so that an electric field value at which reversal of polarization occurs may greatly increase and a time required for the reversal of polarization may be greatly extended even at the same electric field. Although a critical layer thickness at which the above-described degradation phenomenon occurs may vary according to the kind of electrodes disposed on and under an organic ferroelectric layer, it is known that the degradation phenomenon was markedly observed at a layer thickness of about 50 nm or less. Second, the thickness of the organic ferroelectric material layer 208 may be selected so as to improve a data retention characteristic of the memory transistor. Since a data retention time of the memory transistor is closely related to a leakage current characteristic of the organic ferroelectric layer, a deposited thickness of the organic ferroelectric material layer 208 may be optimized to prevent generation of an excessive leakage current during a device operation. According to research results, it is known that a large leakage current may not occur with an applied voltage when the organic ferroelectric layer has a thickness of about 200 nm. Thus, the thickness of the organic ferroelectric material layer 208 may be selected in the range of about 50 to 200 nm in consideration of both the first and second points. However, if any method of improving ferroelectric characteristics despite a reduction in the thickness of the organic ferroelectric layer is developed, the lowest limit of the deposited thickness of the organic ferroelectric material layer 208 may be further reduced.

Figure 4F:
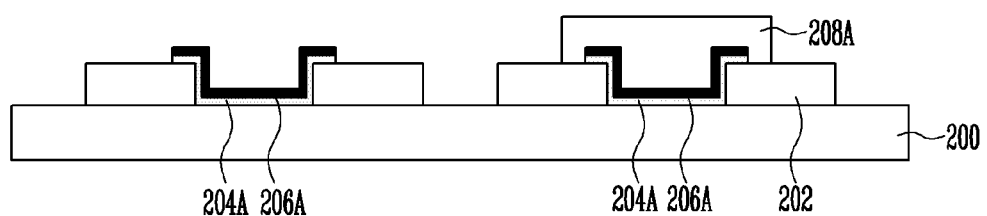

Referring to FIG. 4F, the organic ferroelectric material layer 208 may be selectively removed from the driver transistor region. For example, a photoresist pattern (not shown)

may be formed over the organic ferroelectric material layer 208 to cover the gate electrode region of the memory transistor, and the organic ferroelectric material layer 208 may be etched using the photoresist pattern as an etch barrier. Thereafter, the photoresist pattern may be removed.

As a result, an organic ferroelectric layer 208A, which remains only in the gate electrode region of the memory transistor, may be formed.

In this case, the etching of the organic ferroelectric material layer 208 may be performed in consideration of the following two points.

First, when the organic ferroelectric material layer 208 is etched using oxygen plasma, the conditions of the oxygen plasma may be optimized not to degrade the properties of the semiconductor layer 204A. In general, it is likely that the characteristics of the surface and inside of the semiconductor layer 204A may be considerably changed due to plasma processing. Although the buffer layer 206A may function as a protection layer of the semiconductor layer 204A during the etching of the organic ferroelectric material layer 208, oxygen plasma conditions may be optimized to prevent degradation of the characteristics of the semiconductor layer 204A.

Second, a stripper used for a delamination process of the photoresist pattern used as an etch mask may be appropriately selected not to affect the characteristics of the organic ferroelectric layer 208A. Since chemicals required for the delamination of a typical photoresist pattern detrimentally affect the characteristics of the organic ferroelectric layer 208A, the stripper must be carefully selected. Furthermore, since the removal of the photoresist pattern is performed using a dry etching process, which employs plasma in vacuum unlike a wet etching process, the photoresist pattern may be hardened more seriously, and thus a portion of the photoresist pattern may remain over the organic ferroelectric layer 208A under inappropriate delamination conditions.

A stripper applicable to the delamination of the photoresist pattern may have the following characteristics. First, components of the stripper should not chemically affect the organic ferroelectric layer 208A. For example, when the organic ferroelectric layer 208A is formed of P(VDF-TrFE), components of the stripper should not chemically decompose P(VDF-TrFE) not to cause removal of the organic ferroelectric layer 208A. In addition, the components of the stripper should not greatly change a crystallization state or a chemical combination state of P(VDF-TrFE) not to adversely affect the electrical properties of P(VDF-TrFE). For example, acetone, which is an organic chemical typically applied to delaminate the photoresist pattern, may completely dissolve and remove P(VDF-TrFE). Thus, the method of the present invention cannot adopt acetone as the stripper. Second, the stripper should be capable of completely removing remnant components of the photoresist pattern. When the corresponding stripper cannot effectively remove the remnant components of the photoresist pattern, the remnant components of the photoresist pattern may continuously remain on a portion of the substrate 200 where devices are formed and hinder normal operations of the devices. For instance, an organic chemical containing methanol as a main component may be used to delaminate the photoresist pattern. However, the remnant components of the photoresist pattern cannot be completely removed using methanol according to the kind of the photoresist pattern and the effects of a preceding process.

Accordingly, 1-methoxy-2-propanol may be used as the stripper of the photoresist pattern. Although detailed experimental results for describing the grounds on which 1-methoxy-2-propanol is applied are not described in the present specification, when 1-methoxy-2-propanol is used as the stripper, the photoresist pattern used as the etch mask may be effectively removed without affecting the polarization and leakage current characteristics of P(VDF-TrFE).

Figure 4G:
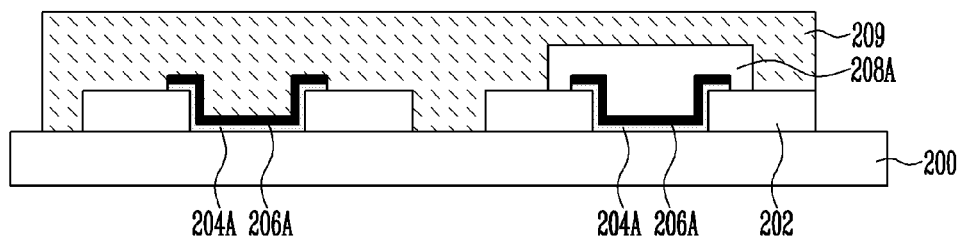

Referring to FIG. 4G, a gate insulating layer 209 may be formed on the entire surface of the resultant structure from which the organic ferroelectric layer 208A is selectively removed.

The gate insulating layer 209 may be formed using a thin-film forming technique of a typical semiconductor manufacturing process, which may satisfy the following two conditions.

First, the gate insulating layer 209 should be formed at a temperature of about 150° C. or lower. The organic ferroelectric layer 208A functioning as a main gate insulating layer of the memory transistor may be disposed under the gate insulating layer 209. The melting point of the organic ferroelectric layer 208A may be about 160° C. Thus, in order to prevent the physical properties of the organic ferroelectric layer 208A from being changed during the formation of the gate insulating layer 209, the gate insulating layer 209 may be formed at a temperature of about 150° C. or lower. As described above, by forming the gate insulating layer 209 at a temperature of about 150° C. or lower, when the memory transistor and the driver transistor are formed on the same substrate 200, process compatibility may be ensured. In other words, the driver transistor may be formed without degrading the characteristics of the memory transistor.

Second, a plasma process should be excluded to form the gate insulating layer 209. Since the plasma process may seriously cause damage to the organic ferroelectric layer 208A, it may be impossible to form the gate insulating layer 209 using a reactive sputtering process.

In consideration of the foregoing two conditions, the gate insulating layer 209 may be formed using an ALD technique or a CVD technique. In particular, since the gate insulating layer 209 may be formed at a temperature of about 150° C. or lower under plasma-free conditions, the gate insulating layer 209 may be formed using an ALD process, which is more appropriate for a low-temperature process.

Meanwhile, the thickness of the gate insulating layer 209 may be appropriately selected in consideration of requirements of the driver TFT. That is, the thickness of the gate insulating layer 209 may be selected so as to satisfy a drain current under application conditions of a threshold voltage for operating the driver transistor and a predetermined voltage.

Figure 4H:
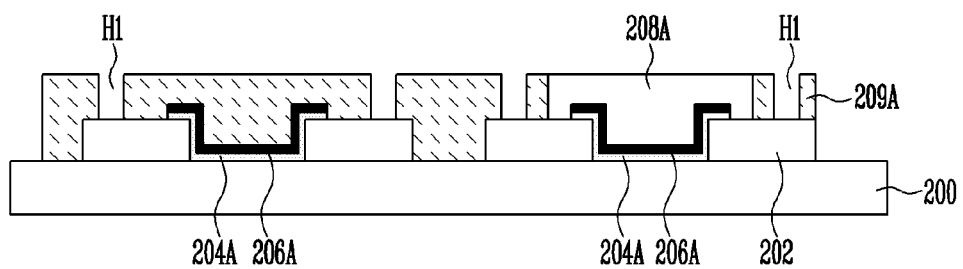

Referring to FIG. 4H, a planarization process may be performed until the surface of the organic ferroelectric layer 208A is exposed. Thereafter, the gate insulating layer 209 may be etched, thereby forming a plurality of via holes H1 exposing the plurality of source and drain electrodes 202, respectively. In the drawings, reference numeral 209A denotes a gate insulating layer etched to form the via hole H1.

The formation of the via hole H1 may include an etching process using a photolithography process and a wet etching process using a predetermined wet etchant.

Figure 4I:
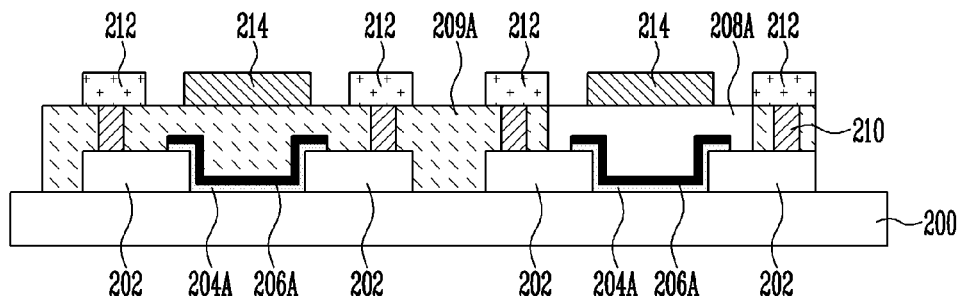

Referring to FIG. 4I, the via holes H1 may be filled with a conductive layer, thereby forming a plurality of contact plugs 210 to be connected to the plurality of source and drain electrodes 202, respectively. Here, the plurality of contact plugs 210 may be formed through the gate insulating layer 209A.

Thereafter, a plurality of source and drain electrode pads 212 may be formed on the plurality of contact plugs 210. The source and drain electrode pads 212 may be electrically connected to the source and drain electrodes 202 through the contact plugs 210. The source and drain electrode pads 212 may be formed using a sputtering process.

Afterwards, a gate electrode 214 may be formed on the organic ferroelectric layer 208A formed in the gate electrode region of the memory transistor. Also, a gate electrode 214 may be formed on the gate insulating layer 209A formed in the gate electrode region of the driver transistor.

In this case, the following two methods may be proposed to form the gate electrode 214 without damaging the organic ferroelectric layer 208A.

First, when the gate electrode 214 is formed of an ITO thin layer, which is a TCO layer, any method for minimizing degradation of the substrate due to a sputtering process may be selected instead of the sputtering process, or an exclusive apparatus designed to minimize the degradation of the substrate due to the sputtering process may be adopted. For example, even if the gate electrode 214 is formed by means of a sputtering apparatus using plasma in vacuum, the distance and position relationship between the substrate and a target may be appropriately controlled to minimize the influence of the sputtering process on the substrate.

Second, instead of forming an ITO layer directly over the organic ferroelectric layer 208A, a TCO thin layer may be previously formed using a process other than a sputtering process, and an ITO layer may be formed thereon. In this case, the influence of the sputtering process on the organic ferroelectric layer 208A may be minimized.

Thus, the transparent nonvolatile memory cell in which the memory transistor and the driver transistor are integrated on the same substrate 200 may be formed. The method of manufacturing the nonvolatile memory cell according to the present embodiment may have the following features.

First, the buffer layers 206A may be formed over the semiconductor layers 204A of gate stacks including the driver transistor and the memory transistor. In this case, the buffer layers 206A may be prepared to ensure good characteristics of the driver and memory transistors. Thus, the buffer layers 206A may be simultaneously formed of the same material using the same process on a planar surface of the same substrate 200.

Second, the organic ferroelectric layer 206A functioning as a main gate insulating layer of the memory transistor may be formed prior to the gate insulating layer 209A functioning as a main gate insulating layer of the driver transistor. When the gate insulating layer 209A is formed prior to the organic ferroelectric layer 206A, the resultant structure having the gate insulating layer 209A should be patterned such that the gate insulating layer 209A remains only in a gate region of the driver transistor. However, since the gate insulating layer 209A and the buffer layer 206A may be formed of the same material according to circumstances and an etch selectivity between the gate insulating layer 209A and the buffer layer 206A cannot be sufficiently ensured, it may be impossible to completely remove the gate insulating layer 209A from the memory transistor. Thus, according to the method of the present embodiment, the organic ferroelectric layer 208A may be formed earlier than the respective main gate insulating layers of the driver and memory transistors.

Third, the organic ferroelectric layer 208A may be disposed only in the gate electrode region of the memory transistor, and the source and drain electrode pads 212 of the driver and memory transistors may be formed over the gate insulating layer 209A. In this case, since all the contact plugs 210 of the driver and memory transistors may be formed using the same process, process uniformity may be increased, and the resistance of via holes may be reduced more than when finer via holes are formed using two processes. Thus, the method of manufacturing the transparent nonvolatile memory cell according to the present embodiment may be characterized by forming all the contact plugs 210 of the driver and memory transistors through the gate insulating layer 209A.

FIGS. 5A through 5I are cross-sectional views illustrating a method of manufacturing the nonvolatile memory cell of FIG. 3. Here, a description of the same components as in the previous embodiment is omitted.

Figure 5A:
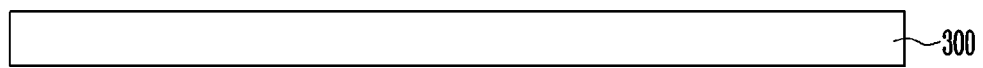
FIGS. 5A through 5I are cross-sectional views illustrating a method of manufacturing the nonvolatile memory cell of FIG. 3.

Referring to FIG. 5A, a substrate 300 on which a memory transistor and a driver transistor are integrated may be provided.

Figure 5B:
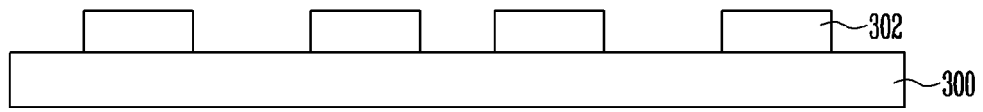

Referring to FIG. 5B, a plurality of source and drain electrodes 302 may be formed on the substrate 300.

Figure 5C:
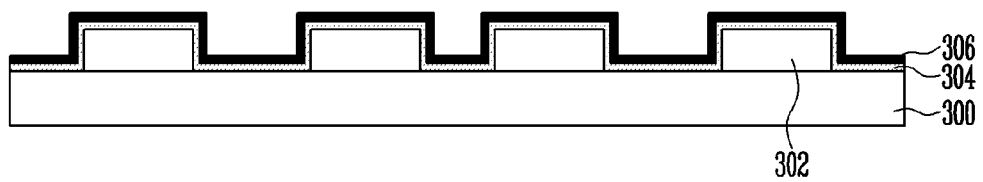

Referring to FIG. 5C, a semiconductor material layer 304 may be formed on the entire surface of the resultant structure having the source and drain electrodes 302, and a buffer material layer 306 may be formed on the semiconductor material layer 304.

Figure 5D:
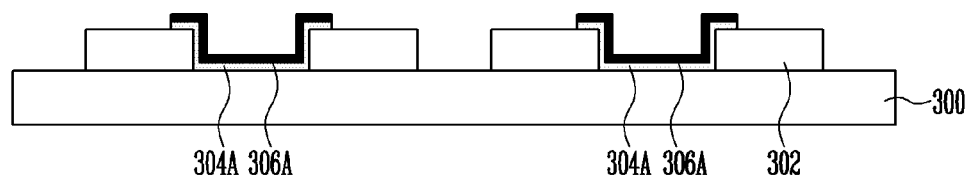

Referring to FIG. 5D, the buffer material layer 306 and the semiconductor material layer 304 may be etched, thereby forming a buffer layer 306A and a semiconductor layer 304A on channel regions of the memory and driver transistors.

Figure 5E:
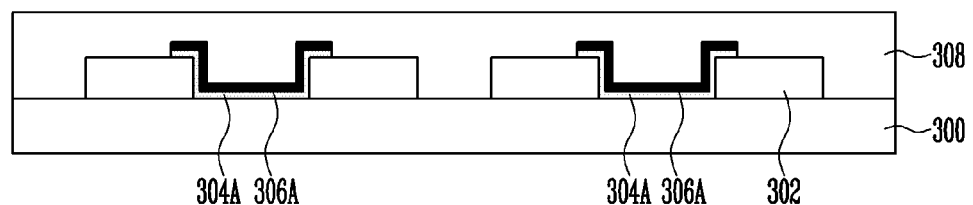

Referring to FIG. 5E, an organic ferroelectric layer 308 may be formed on the entire surface of the resultant structure having the semiconductor layer 304A and the buffer layer 306A.

Figure 5F:
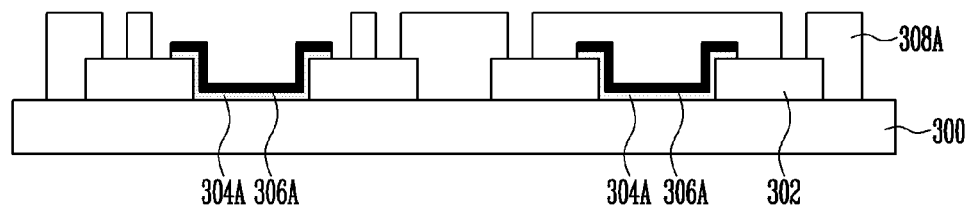

Referring to FIG. 5F, the organic ferroelectric layer 308 may be selectively removed from a driver transistor region. For example, a photoresist pattern may be formed over the organic ferroelectric layer 308 to expose a gate electrode region and a contact plug region of the driver transistor. Thereafter, the organic ferroelectric layer 308 may be etched using the photoresist pattern as an etch barrier. Subsequently, the photoresist pattern serving as an etch mask may be removed.

As a result, the organic ferroelectric layer 308 is removed from the gate electrode region of the driver transistor, and a plurality of via holes H2 may be formed to respectively expose the source and drain electrodes 302. In this case, the organic ferroelectric layer 308 is left on the gate electrode region of the memory transistor and a large region of the substrate 300. In the drawings, reference numeral 308A denotes the organic ferroelectric layer left after an etching process.

Figure 5G:
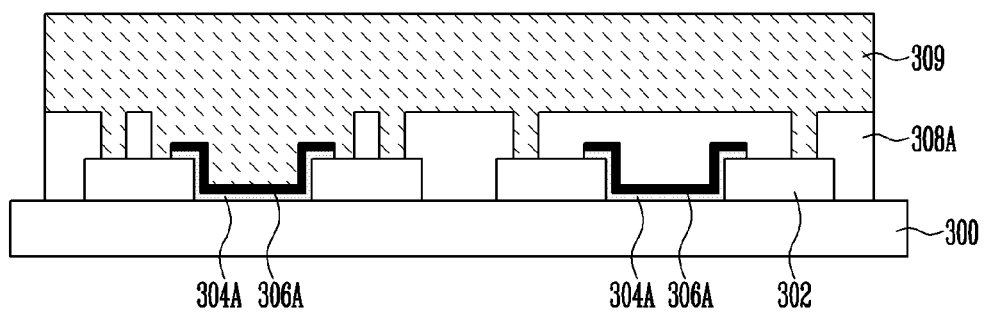

Referring to FIG. 5G, a gate insulating layer 309 may be formed on the entire surface of the resultant structure from which the organic ferroelectric layer 308A is selectively removed. In this case, not only the gate electrode region but also the via holes H2 may be filled with the gate insulating layer 309.

Figure 5H:
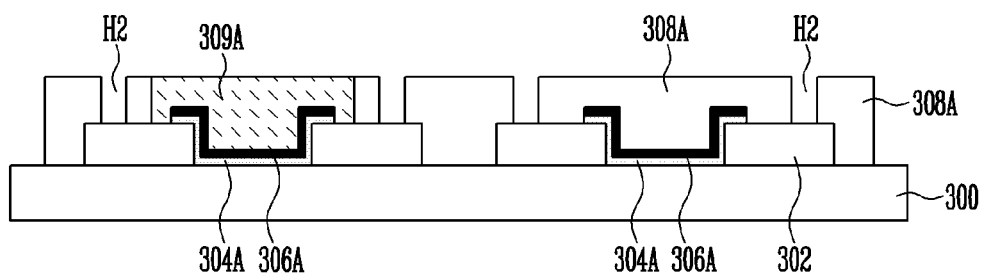

Referring to FIG. 5H, a planarization process may be performed to expose the surface of the organic ferroelectric layer 308A, and the gate insulating layer 309 filling the via holes H2 may be selectively removed by etching. In this case, the gate insulating layer 309 filling the gate electrode region of the driver transistor may be left. In the drawings, reference numeral 309A denotes a gate insulating layer left after an etching process.

Figure 5I:
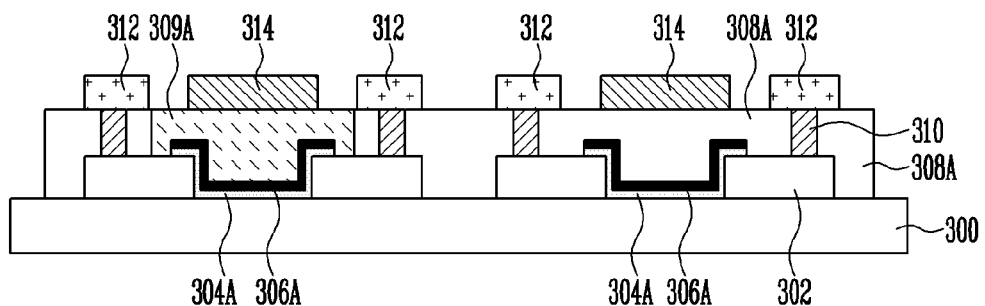

Referring to FIG. 5I, the plurality of via holes H2 may be filled with a conductive layer, thereby forming a plurality of contact plugs 310 to be connected to the plurality of source and drain electrodes 302, respectively. Here, the contact plugs 310 may be formed through the organic ferroelectric layer 308A.

Afterwards, a plurality of source and drain electrode pads 312 may be formed on the plurality of contact plugs 310, respectively.

Thereafter, a gate electrode 314 may be formed on the organic ferroelectric layer 308A formed in the gate electrode region of the driver transistor.

As a result, a transparent nonvolatile memory cell in which a memory transistor and a driver transistor are integrated on the same substrate 300 may be formed. The above-described method of manufacturing the nonvolatile memory cell according to the exemplary embodiment of the present invention may have the following features.

The gate insulating layer 309A may be formed only in the gate electrode region of the driver transistor, while the source and drain electrode pads 312 of the driver and memory transistors may be formed over the organic ferroelectric layer 308A. That is, unlike in the previous second embodiment, an etching process may be performed such that the organic ferroelectric layer 308A remains on a large region of the substrate 300. Thus, as compared with the etching process performed to remain the organic ferroelectric layer only in the gate electrode region of the memory transistor, the process degradation of the organic ferroelectric layer 308 may be reduced during the etching process. Thus, the film quality of the organic ferroelectric layer 308A functioning as the main gate insulating layer of the memory transistor may be improved.

Of course, the organic ferroelectric layer 308A may have a lower density and a higher surface roughness than the gate insulating layer 309A. Thus, a manufacturing process may be optimized in consideration of the above-described characteristics.

The methods of manufacturing the nonvolatile memory cells according to the second and third embodiments are provided only as examples, and the present invention is not limited thereto. In addition, detailed process conditions may be appropriately selected according to the structure and required process of the entire system to be applied.

Furthermore, although the process of manufacturing the nonvolatile memory cell according to the first embodiment is not described in the present specification, the nonvolatile memory cell according to the first embodiment may be manufactured by controlling an etched region of the organic ferroelectric thin layer during the manufacture of the nonvolatile memory cells according to the second and third embodiments.

Figure 6A:
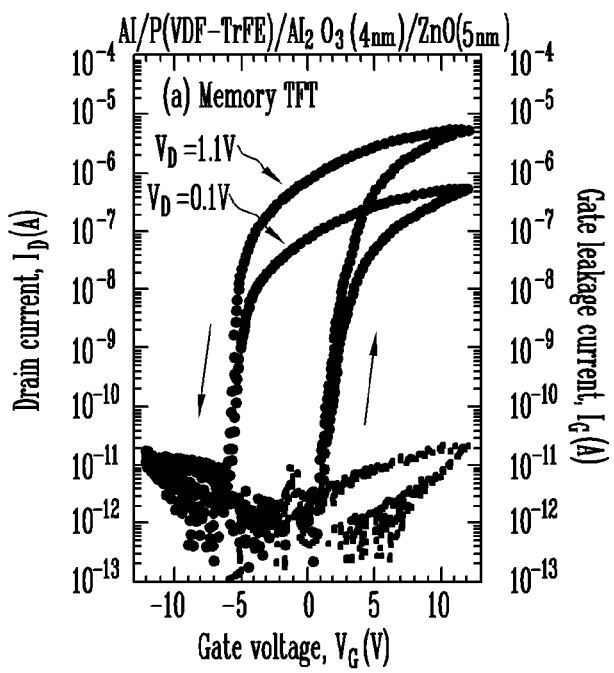
FIGS. 6A and 6B are graphs showing the characteristics of a gate voltage-drain current of a transparent nonvolatile memory cell including a memory transistor and a driver transistor disposed on the same substrate, according to an exemplary embodiment of the present invention.
Figure 6B:
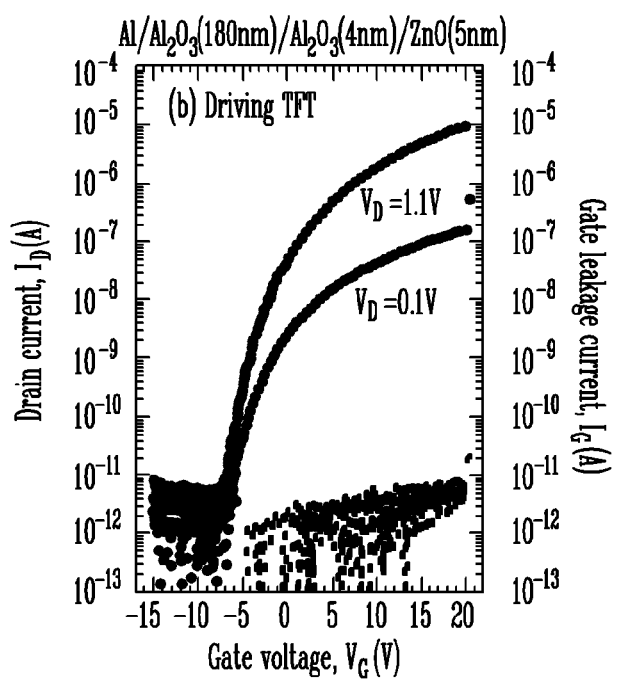

FIGS. 6A and 6B are graphs showing the characteristics of a gate voltage-drain current of a transparent nonvolatile memory cell including a memory transistor and a driver transistor disposed on the same substrate, according to an exemplary embodiment of the present invention. In FIGS. 6A and 6B, the transparent nonvolatile memory cell used to measure the characteristics was manufactured according to the foregoing second embodiment, and a detailed method of manufacturing the transparent nonvolatile memory cell will now be described.

A substrate 200 was a glass substrate, and source and drain electrodes 202 were formed of an ITO thin layer having a thickness of about 150 nm. A semiconductor layer 204A was a 5-nm zinc oxide (ZnO) layer formed using an ALD technique. A buffer layer 206A was a 4-nm aluminum oxide ($Al_2O_3$) layer formed using an ALD technique at a temperature of about 200° C.

An organic ferroelectric layer 208A was a 80-nm P(VDF-TrFE) thin layer. The organic ferroelectric layer 208A was formed using a spin coating process and underwent a crystallization annealing process at a temperature of about 140° C.

The organic ferroelectric layer 208A was etched by means of an oxygen plasma process using a photoresist pattern as an etch barrier.

A gate insulating layer 209A was a 180-nm $Al_2O_3$ layer. The gate insulating layer 209A was formed using an ALD technique at a temperature of about 150° C. The gate insulating layer 209A was etched by means of a wet etching process using a photoresist pattern as an etch barrier.

Source and drain electrode pads 212 and a gate electrode 214 was formed of an Al thin layer. Of course, to embody a transparent nonvolatile memory transistor according to the present invention, the source and drain electrode pads 212 and the gate electrode 214 may be formed of a TCO thin layer. However, even if the source and drain electrode pads 212 and the gate electrode 214 are formed of an Al thin layer, the method of manufacturing the transparent nonvolatile memory cell according to the present invention may be applied.

Referring to FIG. 6A, it can be confirmed that when a gate voltage was applied to the driver transistor and the memory transistor, which are formed on the same substrate according to the embodiment, a drain current exhibited a hysteresis characteristic with a variation in threshold voltage. Specifically, it can be confirmed that a variation of threshold voltage was about 7.2V at a programming voltage of about −12 to 12V. This is because a threshold voltage of the memory transistor was changed due to remnant polarization of the organic ferroelectric layer. Thus, it can be concluded that the memory transistor according to the embodiment has good memory operation characteristics.

Since the memory transistor has an off-current of about $10^{-12}$ A and an on/off operation margin of about $10^7$, it can be seen that the memory transistor exhibits excellent transistor operation characteristics.

Referring to FIG. 6B, it can be confirmed that the driver transistor and the memory transistor formed on the same substrate according to the embodiment have the same operation characteristics as transistors having the same gate stack structure. Thus, it can be seen that a process of integrating the memory transistor according to the embodiment may not deteriorate the operation characteristics of the driver transistor.

Figure 7:
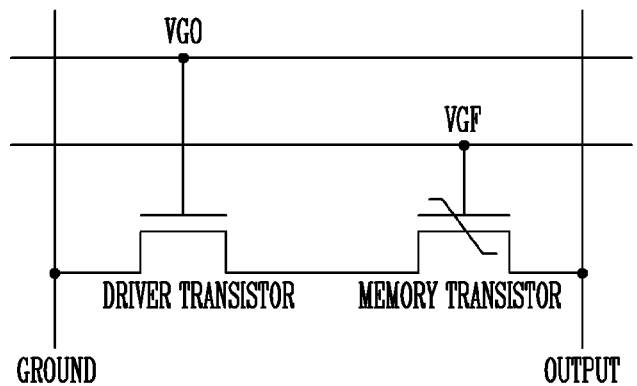
FIG. 7 is a circuit diagram of a memory cell including a memory transistor and a driver transistor disposed on the same substrate, according to an exemplary embodiment of the present invention.

FIG. 7 is a circuit diagram of a memory cell including a memory transistor and a driver transistor disposed on the same substrate, according to an exemplary embodiment of the present invention.

Referring to FIG. 7, a source electrode of the driver transistor may be connected to a ground, a drain electrode of the driver transistor may be connected to a source electrode of the memory transistor, and a current supplied from a drain electrode of the memory transistor may be used as an output signal of the memory cell according to the exemplary embodiment of the present invention. A voltage signal VGO may be applied to a gate electrode of the driver transistor, while a voltage signal VGF may be applied to a gate electrode of the memory transistor.

A circuit configuration of the memory cell according to the exemplary embodiment may not be limited to the circuit configuration of FIG. 7 but have one of various circuit configurations including a single memory transistor and a single driver transistor or a plurality of driver transistors, which may be formed on the same substrate. The circuit configuration of the memory cell of FIG. 7 should be interpreted as an example presented to verify the operating characteristics of the memory cell according to the exemplary embodiment of the present invention.

Figure 8A:
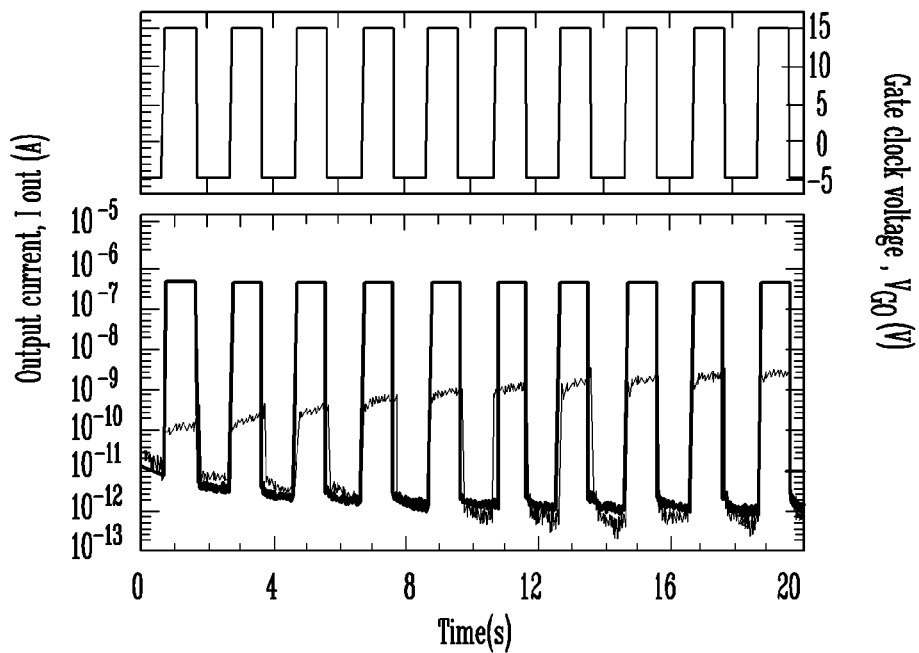
FIGS. 8A and 8B are graphs showing write and read operations of a memory cell including a memory transistor and a driver transistor disposed on the same substrate, according to an exemplary embodiment of the present invention.
Figure 8B:
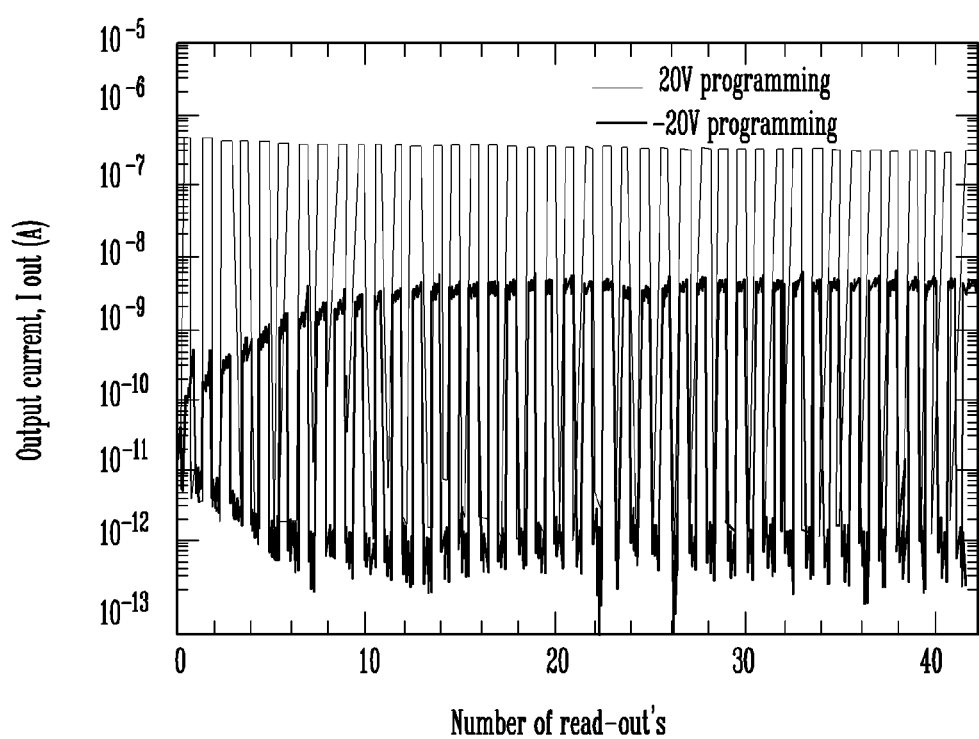

FIGS. 8A and 8B are graphs showing write and read operations of a memory cell including a memory transistor and a driver transistor disposed on the same substrate, according to an exemplary embodiment of the present invention.

Referring to FIG. 8A, initially, a voltage signal VGF of about 20 or −20V was applied to the gate electrode of the memory transistor to store "1" or "0" as a data state of the memory transistor. Thereafter, a current output from an output terminal of the memory cell was measured while continuously applying operation clock signals to the gate electrode of the driver transistor.

In this case, a clock voltage signal VGO applied to the driver transistor was set in the range of −5 to 15V. When a clock voltage signal VGO of about −5V was applied, the driver transistor was completely turned off so that a very small current of about $10^{-12}$ A flowed through the memory cell.

Meanwhile, it can be confirmed that when a clock voltage signal VGO of about 15V was applied, the driver transistor may operate and obtain different currents according to a memory state of the memory transistor that has already enters a data storage state with the previous application of a VGF signal. More specifically, when a VGF signal of about −20V was applied, a current of about $10^{-10}$ to $10^{-9}$ A was output from an output terminal of the memory cell, while when a VGF signal of about 20V was applied, a current of about $10^{-7}$ A flowed. In other words, the memory cell according to the present embodiment may modulate a current output through the output terminal of the memory cell by as much as 100 to 1000 times according to a difference in a write voltage applied to the memory transistor. Furthermore, the memory cell according to the present embodiment may divide the memory state into a standby state and a readout state according to the operation of the driver transistor.

Referring to FIG. 8B, while applying a VGO clock signal to a gate electrode of the driver transistor, a current output from an output terminal of the memory cell was measured over time.

Thus, it can be seen that a memory value may be repetitively read without previously rewriting a memory state stored in the memory transistor every time. That is, it can be confirmed that when a VGF signal of about −20V is applied to the memory transistor and when a VGF signal of about 20V is applied to the memory transistor, the same memory state may be read out 40 times without changing the memory value. From this result, it can be inferred that a memory cell including the memory and driver transistors formed on the same substrate may enable nondestructive read-out operations.

As a result, it may be seen that the method of manufacturing the transparent nonvolatile memory cell according to the present invention is advantageous to embodying the operations of the driver and memory transistors. In this case, the operating characteristics of the memory and driver transistors may be improved by further optimizing the device structures and manufacturing methods according to the present invention. Also, although FIGS. 6A and 6B show only the operating characteristics of discrete devices, the operating characteristics of the driver and memory transistors was also confirmed via the results of FIGS. 6A and 6B. Accordingly, even if source and drain electrodes and a gate electrode are formed of a TCO material, it can be expected that the characteristics of a transparent nonvolatile memory transistor may be confirmed.

Meanwhile, the above-described structures, material combinations, and manufacturing methods of transparent nonvolatile memory transistors may be partially modified to improve device characteristics.

According to the present invention, a nonvolatile memory cell, which is transparent in a visible light region, may include a memory transistor and a driver transistor disposed on the same substrate. Also, the transparent nonvolatile memory cell may be manufactured using a simplified process at reduced costs. In particular, the memory transistor can be mounted in a system so that installation of an external memory can be omitted and packaging costs can be reduced. Therefore, the present invention may contribute to embodying various transparent electronics apparatuses.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A transparent nonvolatile memory cell comprising: a memory transistor including a semiconductor layer, a buffer layer, an organic ferroelectric layer, and a gate electrode disposed on a substrate; a driver transistor including the semiconductor layer, the buffer layer, a gate insulating layer, and the gate electrode disposed on the substrate; a plurality of source and drain electrodes disposed on the substrate at predetermined intervals; and a plurality of source and drain electrode pads connected to the plurality of source and drain electrodes, respectively, wherein the semiconductor layer and the organic ferroelectric layer are disposed on the substrate between the source and drain electrodes to partially cover sidewalls and top surfaces of the source and drain electrodes.

2. The cell of claim 1, wherein the buffer layer is interposed between the semiconductor layer and the organic ferroelectric layer and cuts off a leakage current supplied from the organic ferroelectric layer.

3. The cell of claim 1, wherein the buffer layer includes a silicon-based insulating layer, a silicate insulating layer, or an aluminum oxide layer.

4. The cell of claim 1, wherein the buffer layer has a thickness of about 4 to 10 nm.

5. The cell of claim 1, wherein the organic ferroelectric layer is formed of P(VDF) or P(VDF-TrFE).

6. The cell of claim 1, wherein the semiconductor layer is formed of a transparent semiconducting oxide layer.

7. The cell of claim 1, wherein source and drain electrode pads of the memory transistor are connected to the source and drain electrodes by a contact plug formed through the organic ferroelectric layer, and
   source and drain electrode pads of the driver transistor are connected to the source and drain electrodes by a contact plug formed through the gate insulating layer.

8. The cell of claim 1, wherein the organic ferroelectric layer is disposed only on a channel region of the memory transistor, and source and drain electrode pads of the memory and driver transistors are connected to the source and drain electrodes by a contact plug formed through the gate insulating layer.

9. The cell of claim 1, wherein the gate insulating layer is disposed only on a channel region of the driver transistor, and source and drain electrode pads of the memory and driver transistors are connected to the source and drain electrodes by a contact plug formed through the organic ferroelectric layer.

10. The cell of claim 1, wherein the memory transistor and the driver transistor are disposed on the same substrate.

11. The cell of claim 1, wherein a current output through an output terminal of the memory cell is modulated according to a write voltage applied to the gate electrode of the memory transistor.

12. A transparent nonvolatile memory cell comprising:
a substrate;
a first semiconductor layer and a second semiconductor layer on the substrate;
a first buffer layer on the first semiconductor layer and a second buffer layer on the second semiconductor layer;
an organic ferroelectric layer on the first buffer layer and a gate insulating layer on the second buffer layer; and
a first gate electrode on the gate insulating layer and a second gate electrode on the organic ferroelectric layer,
wherein the transparent nonvolatile memory cell includes:
a transparent memory transistor including the first semiconductor layer, the first buffer layer, the organic ferroelectric layer, and the first gate electrode disposed on the substrate; and
a transparent driver transistor including the second semiconductor layer, the second buffer layer, the gate insulating layer, and the second gate electrode disposed on the substrate;
a plurality of source and drain electrodes disposed on the substrate at predetermined intervals; and
a plurality of source and drain electrode pads connected to the plurality of source and drain electrodes, respectively,
wherein the first and second semiconductor layers and the organic ferroelectric layer are disposed on the substrate between the source and drain electrodes to partially cover sidewalls and top surfaces of the source and drain electrodes.

13. The cell of claim 12, wherein:
the organic ferroelectric layer has a lower surface facing the substrate and an upper surface opposite to the lower surface;
the gate insulating layer has a lower surface facing the substrate and an upper surface opposite to the lower surface of the gate insulating layer; and
the upper surface of the organic ferroelectric layer is flush with the upper surface of the gate insulating layer.

14. The cell of claim 13, wherein the organic ferroelectric layer and the gate insulating layer are disposed side by side and come in contact with each other.

* * * * *